United States Patent
Novellini et al.

(10) Patent No.: US 10,547,317 B1
(45) Date of Patent: Jan. 28, 2020

(54) LOW LATENCY RECEIVER

(71) Applicant: Xilinx, Inc., San Jose, CA (US)

(72) Inventors: Paolo Novellini, Gorgonzola (IT);
David F. Taylor, Edinburgh (GB);
Alastair J. Richardson, Guildford (GB)

(73) Assignee: XILINX, INC., San Jose, CA (US)

(*) Notice: Subject to any disclaimer, the term of this patent is extended or adjusted under 35 U.S.C. 154(b) by 0 days.

(21) Appl. No.: 16/458,859

(22) Filed: Jul. 1, 2019

(51) Int. Cl.
*H03L 7/085* (2006.01)
*H04B 1/08* (2006.01)
*H03L 7/099* (2006.01)

(52) U.S. Cl.
CPC .............. *H03L 7/085* (2013.01); *H03L 7/099* (2013.01); *H04B 1/08* (2013.01)

(58) Field of Classification Search
USPC .................................. 327/147–149, 156–158
See application file for complete search history.

(56) References Cited

U.S. PATENT DOCUMENTS

| | | | | | |
|---|---|---|---|---|---|
| 6,002,279 A | * | 12/1999 | Evans | ........................ | H03L 7/07 327/144 |
| 7,467,319 B1 | * | 12/2008 | Kao | ........................ | H04L 12/56 713/500 |
| 7,888,973 B1 | * | 2/2011 | Rezzi | ...................... | H03L 7/085 327/105 |
| 8,989,283 B1 | * | 3/2015 | Dabiri | .................... | H04L 5/1423 375/257 |
| 2008/0284476 A1 | * | 11/2008 | Kwan | ........................ | G06F 1/08 327/156 |
| 2008/0317051 A1 | * | 12/2008 | Dantzig | ................ | G06F 9/5038 370/401 |
| 2012/0307875 A1 | * | 12/2012 | Maguire | ................ | H01Q 21/28 375/219 |
| 2013/0159163 A1 | * | 6/2013 | Kayanuma | ............. | G06Q 40/00 705/37 |
| 2013/0262287 A1 | * | 10/2013 | Parsons | .................. | G06Q 40/04 705/37 |
| 2014/0133530 A1 | * | 5/2014 | Maguire | ............... | H04W 60/00 375/219 |
| 2014/0376566 A1 | * | 12/2014 | Mehta | ................... | H04L 49/357 370/419 |

(Continued)

OTHER PUBLICATIONS

Microsemi, "UG0677: PolarFire FPGA Transceiver User Guide", v. 4.0, Oct. 2018. 98 pages.

*Primary Examiner* — Adam D Houston
(74) *Attorney, Agent, or Firm* — Patterson + Sheridan, LLP

(57) ABSTRACT

A device includes a physical medium attachment (PMA), a physical coding sublayer (PCS), a phase detector, and an oscillator. The PMA receives data at a first speed and overclocks the received data to a second speed, wherein the second speed is higher than the first speed. The PCS receives the data at the second speed. The phase detector receives another data from the PCS wherein the another data is based on the received data at the second speed or the phase detector is configured to receive the data at the second speed directly from the PMA. The phase detector adjusts a phase based on bit transitions. The oscillator is coupled to the phase detector and generates a reference clock signal wherein a phase of the reference clock is adjusted by the phase detector. The oscillator clocks the PMA based on the adjusted clock.

21 Claims, 10 Drawing Sheets

(56) References Cited

U.S. PATENT DOCUMENTS

| | | | |
|---|---|---|---|
| 2015/0142637 A1* | 5/2015 | McGeachy | G06Q 40/04 |
| | | | 705/37 |
| 2018/0123733 A1* | 5/2018 | Yang | H04L 1/0043 |
| 2018/0175865 A1* | 6/2018 | Gu | H03L 7/087 |
| 2018/0285840 A1* | 10/2018 | Hasan | G06Q 20/0655 |
| 2019/0020466 A1* | 1/2019 | Raymond | H04B 10/29 |
| 2019/0260380 A1* | 8/2019 | Carlough | G06F 1/06 |

\* cited by examiner

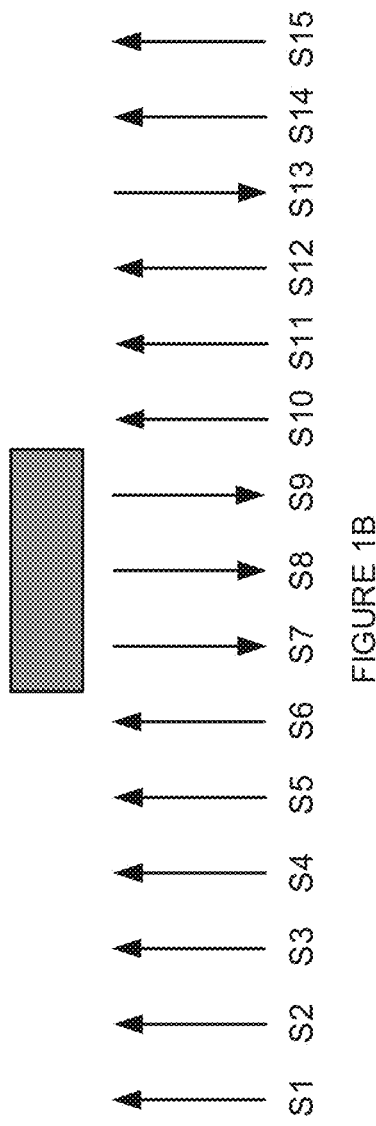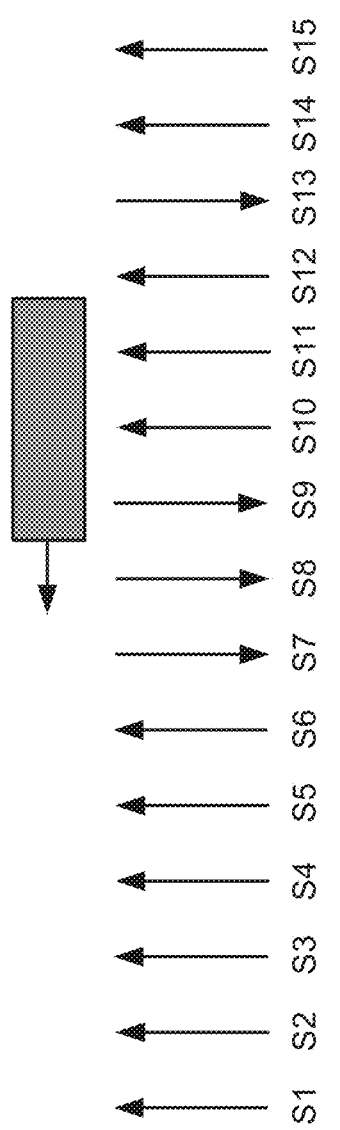

LOW LATENCY RECEIVER

TECHNICAL FIELD

The disclosure generally relates to a receiver and, in particular, to overclocking physical medium attachment (PMA).

BACKGROUND

Certain communication applications benefit from lower latency. For example, automated transactions make up the majority of exchange trades and benefit tremendously from lower latency connections between components including market data feeds from various datacentres that are transmitted over a communication channel, e.g., fibre, microwave, copper, etc., as well as connections to the stock exchange for trading and local market data. Accordingly, certain transactions and/or applications such as high frequency trading in Financial Technology (FinTech) benefit tremendously by lower latency. As a result, many high frequency traders are located in close proximity to the stock exchanges in order to reduce the latency.

Unfortunately, transceiver latency accounts for approximately 50% of the overall latency of the electronic circuitries used in the trades. Accordingly, some efforts have been made in reducing the latency of the transceivers. However, no effort has been made in improving the latency of the physical medium attachment (PMA) by overclocking the PMA portion of the transceiver.

SUMMARY

Accordingly, a need has arisen to overclock the physical medium attachment (PMA) while controlling the jitter tolerances and while guaranteeing the run-length performance. It is appreciated that in some embodiments, the PMA may be overclocked regardless of whether the latency of the physical coding sublayer (PCS) is reduced. For example, the PMA may be overclocked to reduce the latency of the PMA while the PCS is being overclocked or while the PCS is being bypassed in order to reduce the latency of the PCS. In some embodiments, the PMA may be overclocked while the PCS is left untouched.

In some nonlimiting examples, a device includes a physical medium attachment (PMA), a physical coding sublayer (PCS), a phase detector, and an oscillator. The PMA receives data at a first speed and overclocks the received data to a second speed, wherein the second speed is higher than the first speed. The PCS receives the data at the second speed. The phase detector receives another data from the PCS wherein the another data is based on the received data at the second speed or the phase detector is configured to receive the data at the second speed directly from the PMA. The phase detector adjusts a phase based on bit transitions. The oscillator is coupled to the phase detector and generates a reference clock signal wherein a phase of the reference clock is adjusted by the phase detector. The oscillator clocks the PMA based on the adjusted clock.

In some embodiments, the device further includes a phase locked loop (PLL) coupled to the oscillator. The PLL is configured to increase a frequency of the adjusted clock. It is appreciated that the PCS may be overclocked to increase speed of the data at the second speed to a third speed. The data at the third speed is transmitted to the phase detector. In some nonlimiting examples, the data transmitted by the PMA bypasses the PCS and is received by the phase detector.

In some nonlimiting examples, the device further includes a directional interface configured to facilitate transmission of the data from the PMA to the phase detector. It is appreciated that in some nonlimiting examples, the device includes a contra directional interface configured to facilitate transmission of the another data from the PCS to the phase detector.

In some nonlimiting examples, the device further includes a filter coupled to output of the phase detector to accumulate statistical data associated with a phase to be adjusted. The phase detector may be implemented within a fabric of a field programmable gate array (FPGA) and the PMA and the PCS may be implemented within a transceiver where a lock to reference of the PMA is disabled.

According to some nonlimiting embodiments, a device includes a PMA, a PCS, a phase detector, an oscillator, and a PLL. The PMA may be configured to receive data a first speed. The PMA is further configured to overclock the received data to a second speed wherein the second speed is higher than the first speed. The PCS is configured to receive the data at the second speed. The phase detector is configured to receive another data from the PCS wherein the another data is based on the received data at the second speed or the phase detector is configured to receive the data at the second speed from the PMA. The phase detector may further be configured to adjust a phase based on bit transitions. The oscillator is configured to generate a clocking signal. The PLL is coupled to the phase detector. The PLL is configured to increase a frequency of a clock, and wherein the PLL is adjusted based on the phase adjustment of the phase detector to generate a reference clock signal. The PLL is configured to clock the PMA based on the reference clock.

In some nonlimiting embodiments, a device includes a PMA configured to receive data at a first speed. The PMA is further configured to receive a clocking signal and to overclock the received data to a second speed wherein the second speed is higher than the first speed. The PCS is configured to receive the data at the second speed. The phase detector is configured to receive another data from the PCS wherein the another data is based on the received data at the second speed or the phase detector is configured to receive the data at the second speed from the PMA. The phase detector is further configured to generate a control signal based on bit transitions. The control signal is transmitted from the phase detector to the PMA and the control signal adjusts a phase of the clocking signal for the PMA that controls lock to reference of the PMA.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIGS. 1B-1E show illustrative phase detection and correction, according to some examples.

To facilitate understanding, identical reference numerals have been used, where possible, to designate identical elements that are common to the figures. It is contemplated that elements of one example may be beneficially incorporated in other examples.

DETAILED DESCRIPTION

Figure 1A:
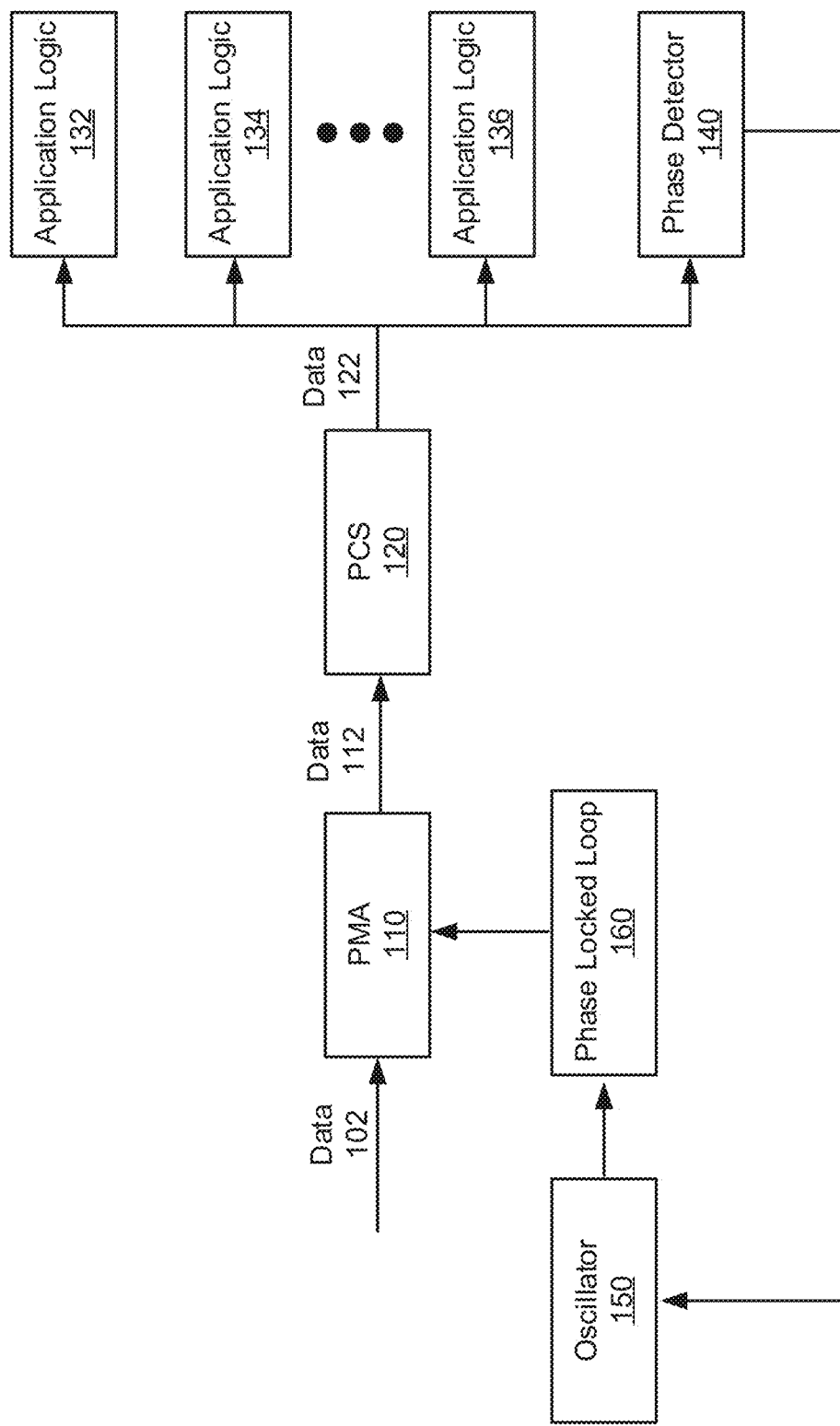
FIG. 1A shows a block diagram depicting a transceiver where its physical medium attachment (PMA) is overclocked, according to some examples.

Examples described herein relate to reducing the latency of a physical medium attachment (PMA) within a transceiver such as a 10 Gbe serializer/deserializer (serdes). As discussed above, certain applications such as HFT can benefit from lower latency. Accordingly, the embodiments described herein address lowering latency within the PMA that can be used in conjunction with other mechanisms to reduce the latency, e.g., reducing latency within the physical coding sublayer (PCS). For example, the receiver of the PMA may be overclocked to reduce the latency of the PMA while the PCS is being overclocked or while the PCS is being bypassed in order to reduce the latency of the PCS. In some embodiments, the PMA may be overclocked while the PCS is left untouched. Efforts to reduce transceiver latency can reduce the overall latency by approximately 25% or more. The PMA is overclocked according to some nonlimiting examples while the jitter is controlled within the appropriate tolerances and while the run-length performance is guaranteed. It is appreciated that the embodiments are described with references to serdes transceiver with 10 Gbe and implementation within a field programmable gate array (FPGA) for illustrative purposes. As such, it is appreciated that the embodiments and their description with respect to 10 Gbe serdes transceiver and its implementation within the FPGA should not be construed as limiting the scope.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. For example, various methods according to some examples can include more or fewer operations, and the sequence of operations in various methods according to some examples may be different than described herein. In addition, an illustrated example need not have all the aspects or advantages shown. An aspect or an advantage described in conjunction with a particular example is not necessarily limited to that example and can be practiced in any other examples even if not so illustrated or if not so explicitly described.

Some general concepts will first be described to clarify terms and nomenclature used throughout this description.

Referring now to FIG. 1A, a block diagram depicting a transceiver where its physical medium attachment (PMA) is overclocked, according to some examples is shown. The transceiver may include the PMA 110 and the PCS 120. The data 102, at a certain speed such as 10 Gbe, is received by the transceiver and sent to one or more applications, e.g., application logics 132, 134, ..., 136. The application logics may include any application such as HFT application that may benefit from lower latency. The PMA 110 is overclocked, e.g., 2×, 3×, etc. In some embodiments, the clock and data recovery (CDR) of the PMA 110, e.g., implemented in the serdes receiver, is disabled. The PMA 110 is configured to lock onto the received data 102 using the received clocking signal from an oscillator 150 and/or phase locked loop (PLL) 160. The PMA 110 may sample the received data 102 to generate data 112. For example, each received bit may be sampled three times, four times, etc. As an illustrative example, if the received data 102 is 10 Gbe and 3× the sampling is used, the PMA 110 generates 30.9375 Gbit/s.

As shown in FIG. 1A, data 112 is transmitted to the PCS 120. In some embodiments, the PCS 120 is configured with a clocking structure where the received data 112 bypasses a first-in-first-out (FIFO) buffer, thereby reducing the latency. In some embodiments, the PCS 120 may be overclocked to the interface (e.g., serdes interface of the fabric) by silicon screening. Data 122 is generated using PCS 120, which may have a different speed, e.g., higher speed, than its input data 112 speed. It is appreciated that the data 122 may be transmitted to the applications using a contra directional interface. In some illustrative examples, the PCS 120 may be bypassed altogether by providing the data 112 to the applications, e.g., within the fabric, using a directional interface. It is appreciated that a local clock tree may be used for bypassing the PCS 120. As a result, whether the PCS 120 is overclocked, whether the FIFO is bypassed, and whether the PCS 120 is bypassed, the latency is improved. However, it is further appreciated that the PCS 120 may remain unaltered.

In some embodiments, the data 122 may be the same as data 112 if the PCS 120 is bypassed. The data 122 may be different from data 112 if the PCS 120 is overclocked. The data 122 is transmitted to the appropriate application logic, e.g., application logics 132, 134, ..., 136. It is further appreciated that the data 122 is transmitted to the phase detector 140. The operation of the phase detector 140 is now described with references to FIGS. 1B-1E. The phase detector 140 may receive data samples, $S_1, S_2, S_3, \ldots, S_{15}$. The phase detector 140 may determine from the transitions between the data samples whether the phase should be adjusted. For example, in FIG. 1B, the phase detector 140 window covers sample data $S_7$, $S_8$, and $S_9$ that has transitioned from sample data $S_6$. The window corresponds to period for each bit of the speed of data 102. For example, for data 102 at 10 Gbe, the window may be 97 ps. Since the phase detector 140 window covers the sample data $S_7$, $S_8$, and $S_9$ having the same bit values and knowing that the PMA 110 sampled the received data 3×, it is determined that no phase adjustment is needed. In contrast, in FIG. 1C, the phase detector 140 window covers sample data $S_9$, $S_{10}$, and $S_{11}$ having different values, where $S_9$ has the same value as two prior sample bits $S_7$, and $S_8$, and a different value than sample data $S_{10}$ and $S_{11}$. Accordingly, the phase detector 140 may determine that the phase should be adjusted, e.g., shifted to the left (as shown).

Figure 1D:
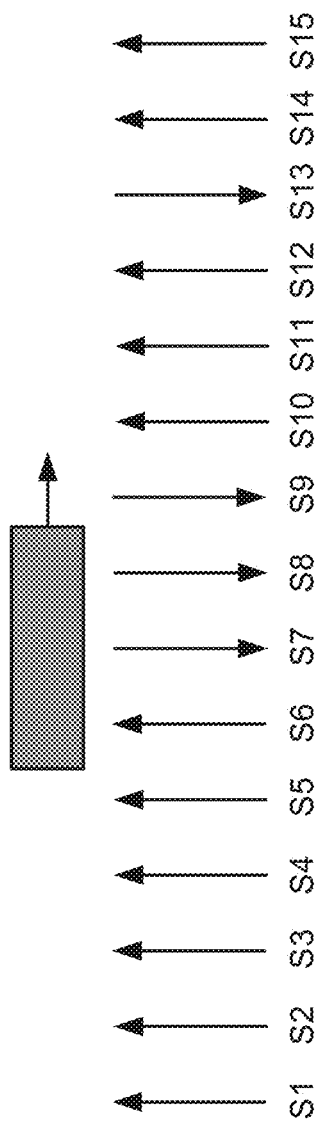
Figure 1E:
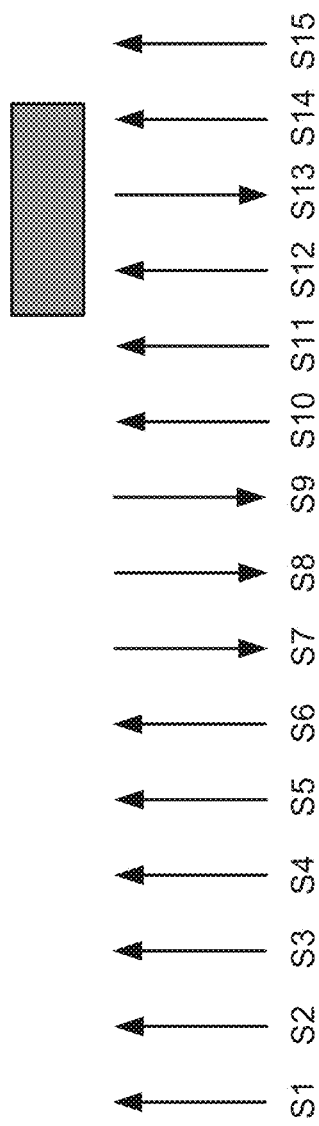

Referring now to FIG. 1D, the phase detector 140 window covers sample data $S_6$, $S_7$, and $S_8$ having different values, where $S_6$ has the same value as prior sample bits and a different value than sample data $S_7$ and $S_8$. Accordingly, the phase detector 140 may determine that the phase should be adjusted, e.g., shifted to the right (as shown). In contrast, referring now to FIG. 1E, the phase detector 140 window covers sample data $S_{12}$, $S_{13}$, and $S_{14}$. The sample data $S_{13}$ has a different value than preceding sample data, e.g., $S_{10}$, $S_{11}$, $S_{12}$, and subsequent sample data, e.g., $S_{14}$ and $S_{15}$. Knowing that the PMA 110 sample the received data 102 3×, the phase detector 140 may determine that $S_{13}$ having a different value from its preceding bits and subsequent bits may be due to jitter or other errors. As such, the phase detector 140 may determine that no change to the phase is warranted.

In some embodiments, the phase detector 140 outputs a signal to the oscillator 150 in order to adjust its phase. The oscillator 150 is tunable where the phase and frequency of the oscillator 150 is controlled such that the sample data transitions become locked to a fixed position in the fabric interface. The oscillator 150 generates a reference clocking signal that may be fed into a phase locked loop (PLL) 160 in order to increase the frequency, in some embodiments. The output of the PLL 160 is fed into the PMA 110 in order to lock onto the received signal 102 with the appropriate phase for the clocking signal. In other words, the CDR functionality of the PMA 110 is disabled because it is setup through the external oscillator 150 and the phase detector 140. It is appreciated that the phase detector 140 does not increase the latency of the receiver since it operates in parallel to other application logics instead of series operation.

It is appreciated that the transceiver that includes the PMA 110, the PCS 120, and the PLL 160 may be implemented within an FPGA. The application logics 132, 134, . . . , 136, and a phase detector 140 may be implemented in the fabric. The oscillator 150 may be implemented on the board. The PCS 120 is coupled to the application logics 132, 134, . . . , 136 and the phase detector 140 through the fabric interface. However, it is appreciated that the implementation using an FPGA is for illustrative purposes and should not be construed as limiting the embodiments. For example, an application specific integrated circuit (ASIC) may be used or a combination of ASIC and an FPGA may be used. It is appreciated that the embodiments are described with PLL 160 for illustrative purposes. However, it is appreciated that the use of PLL 160 should not be construed as limiting the scope of the embodiments. For example, in some embodiments, the oscillator 150 may generate the clocking signal and feed it into the PMA 110 without using a PLL.

Figure 2:
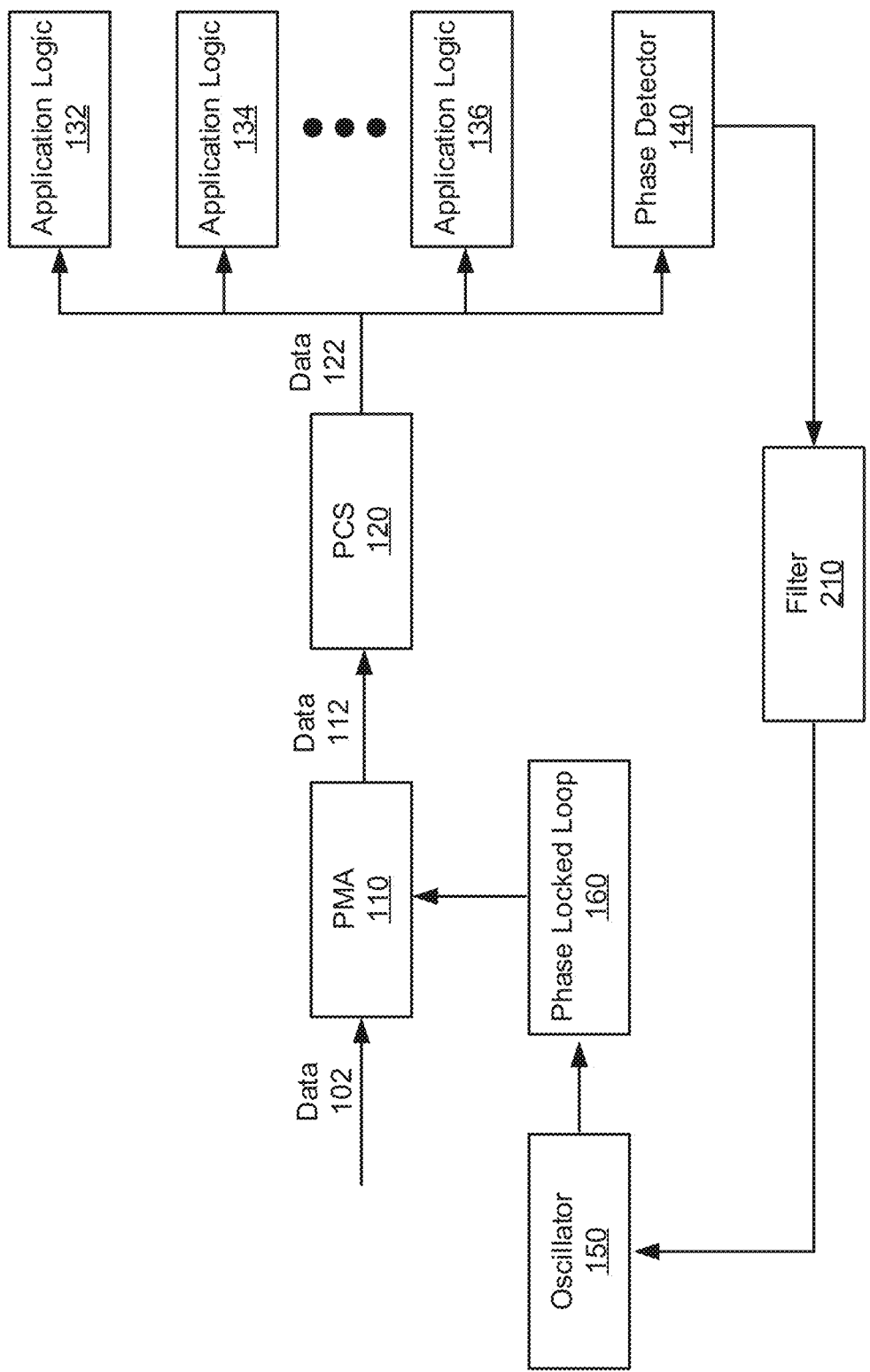
FIG. 2 shows another block diagram depicting a transceiver where its PMA is overclocked, according to some examples.

Referring now to FIG. 2, another block diagram depicting a transceiver where its PMA is overclocked, according to some examples is shown. FIG. 2 is similar to FIG. 1A, except that a filter 210 is coupled to the phase detector 140 in order to gather statistical information regarding the sample data transition and a change in phase. For example, the filter 210 may gather data for a certain period of time and once it is determined that a change in phase is appropriate for that period, then a signal may be generated to change the phase of the clocking signal being generated by the oscillator 150.

Figure 3A:
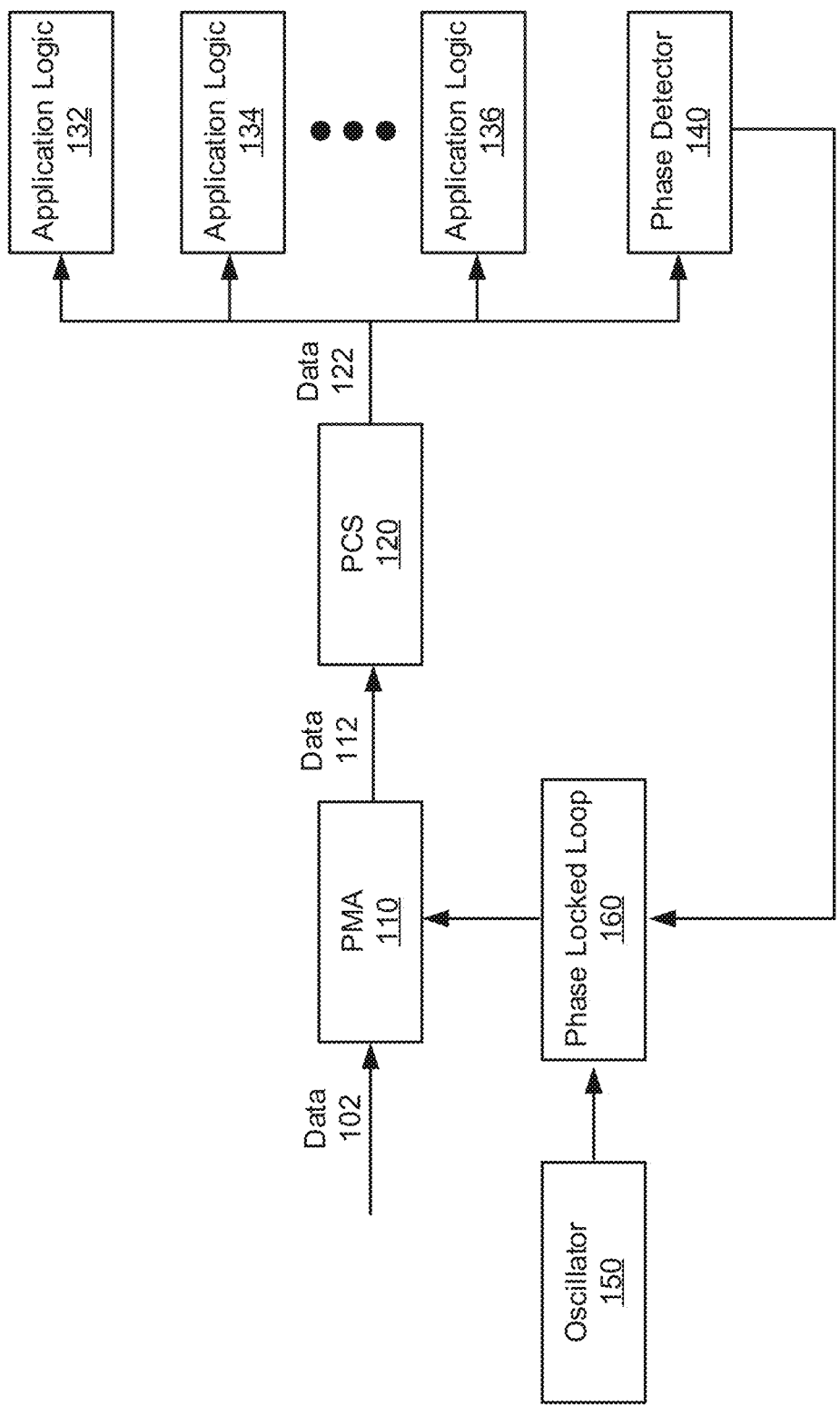
FIGS. 3A-3B show a block diagram depicting an alternative overclocked PMA implementation within a transceiver, according to some examples.
Figure 3B:
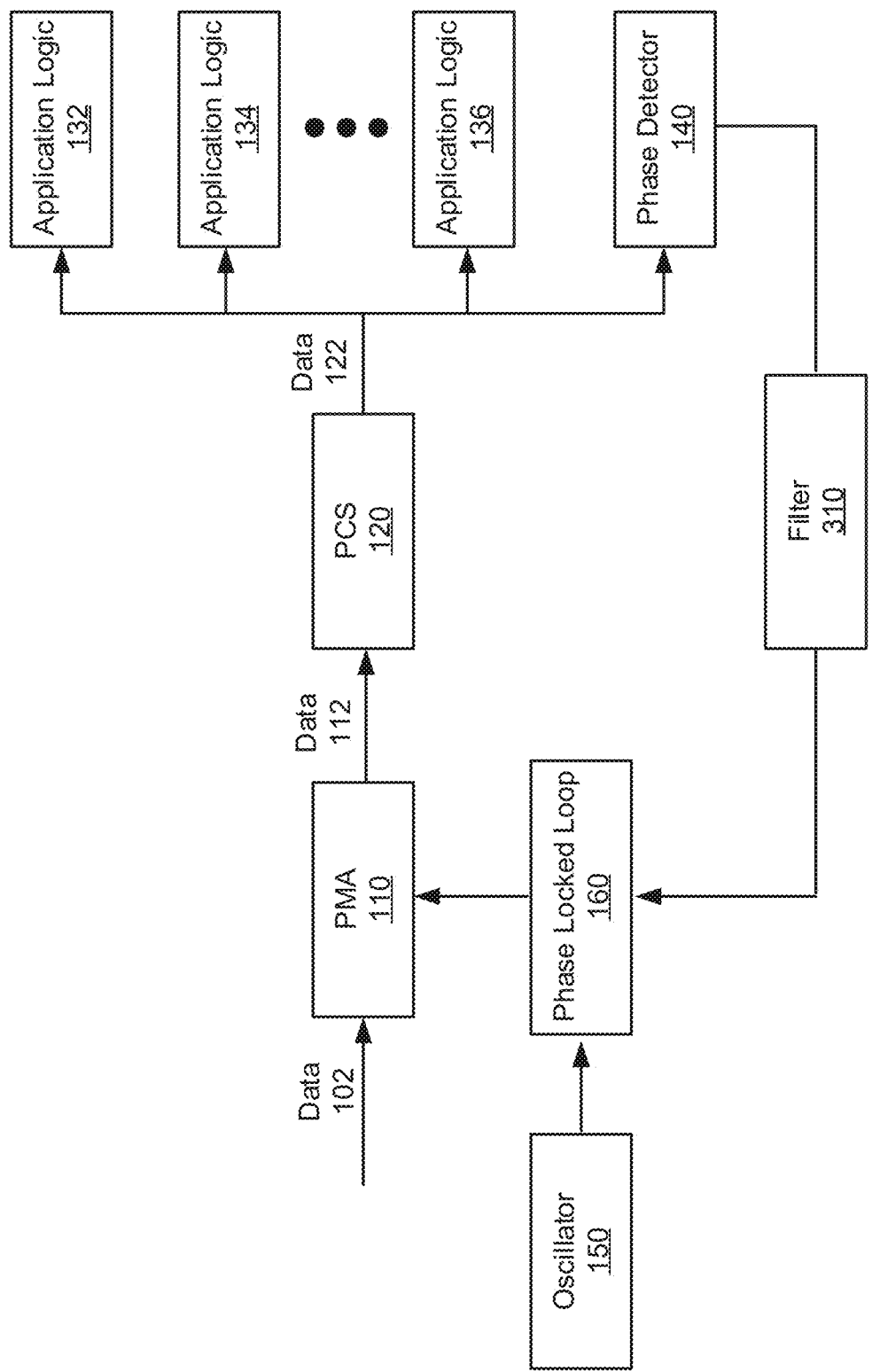

Referring now to FIGS. 3A-3B, a block diagram depicting an alternative overclocked PMA implementation within a transceiver, according to some examples is shown. FIG. 3A is substantially similar to that of FIG. 1A. However, in this embodiment, the change in phase controls the PLL 160 instead of the oscillator 150. In other words, the oscillator 150 may be a free running oscillator that is not controlled by the phase detector 140. However, the phase detector 140 modulates the output frequency of the PLL 160. FIG. 3B is similar to FIG. 3A except that it includes a filter 310 similar to the one described in FIG. 2.

Figure 4A:
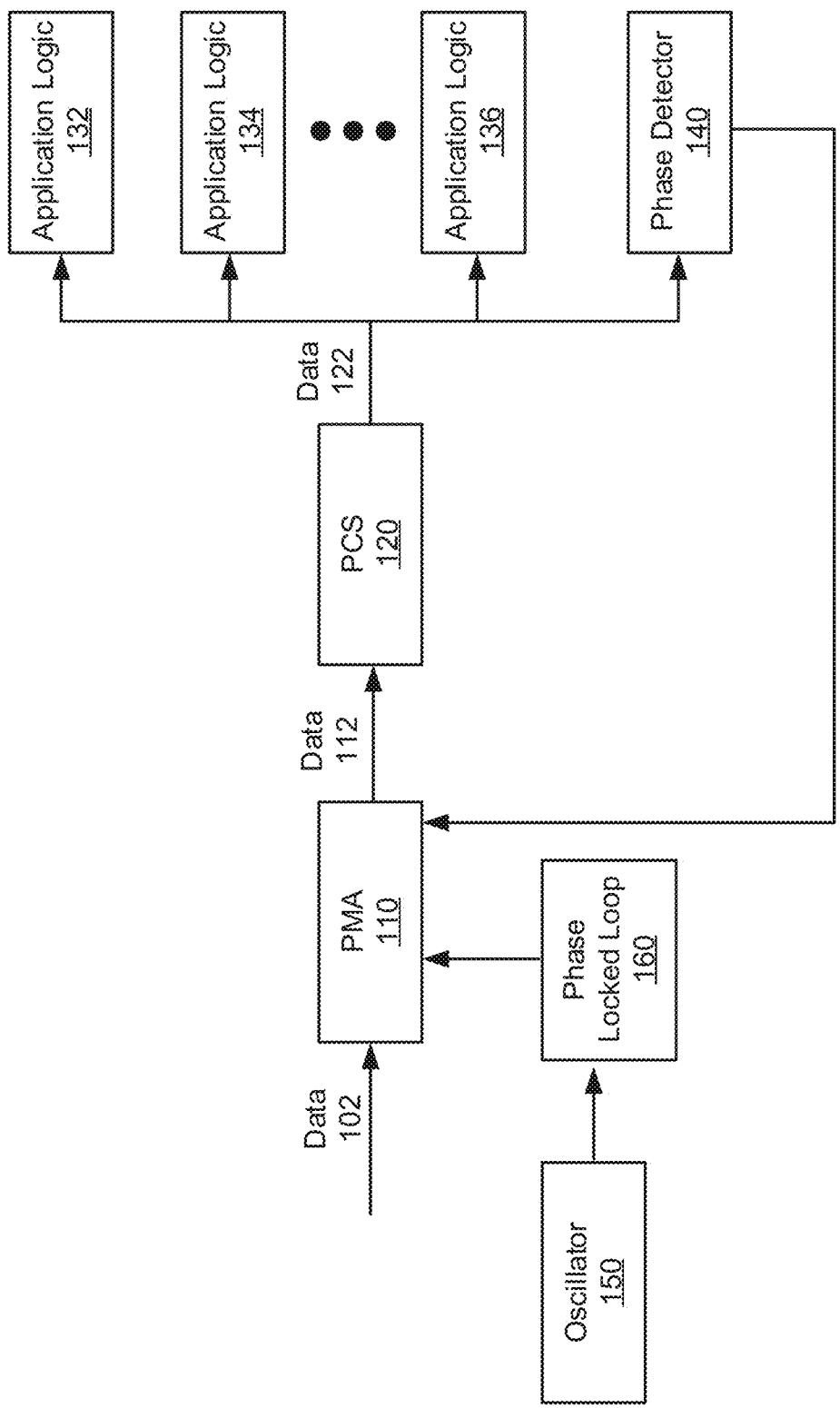
FIGS. 4A-4B show another block diagram depicting another alternative overclocked PMA implementation within a transceiver, according to some examples.
Figure 4B:
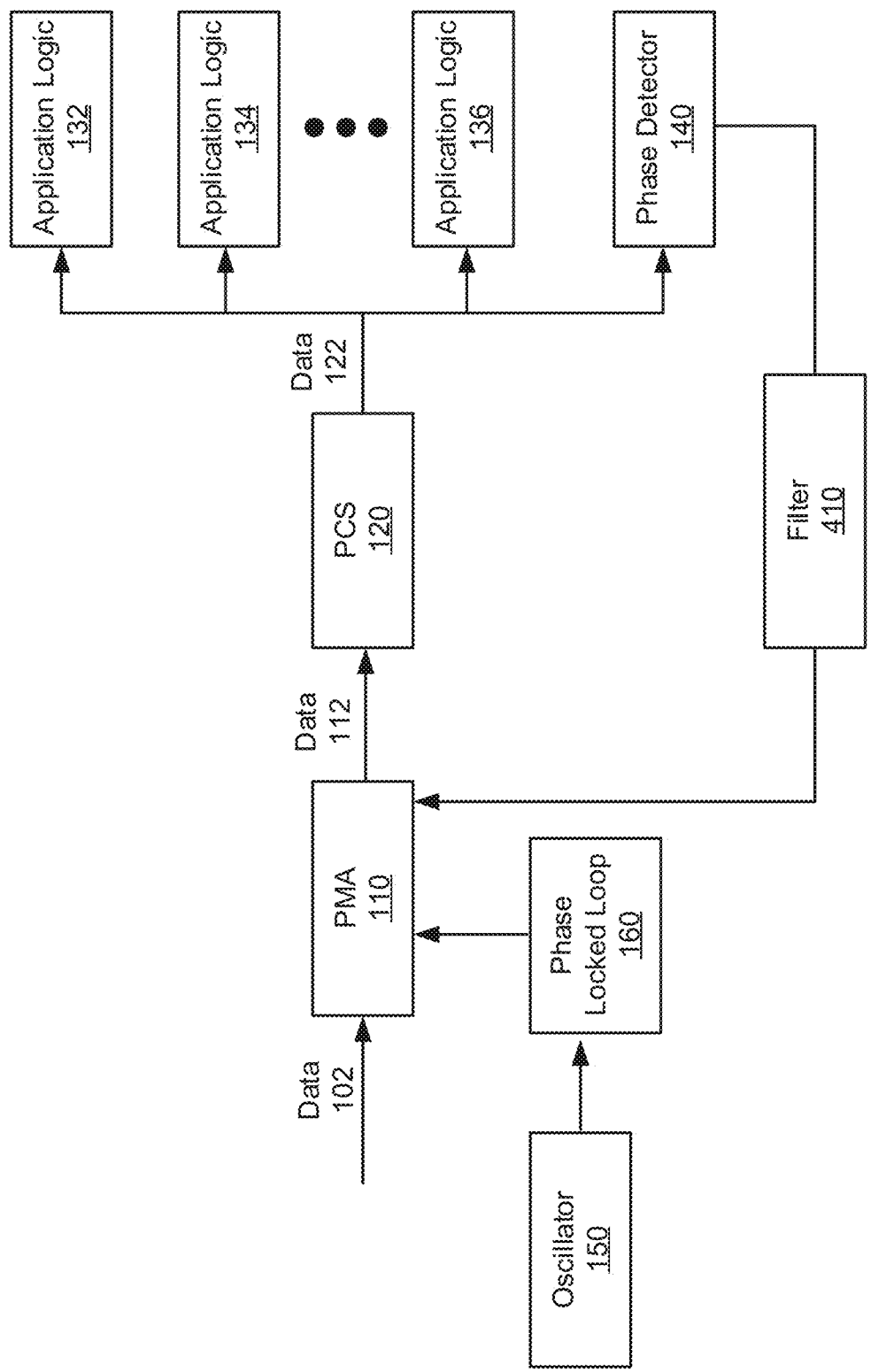

Referring now to FIGS. 4A-4B, another block diagram depicting another alternative overclocked PMA implementation within a transceiver, according to some examples is shown. FIG. 4A is substantially similar to that of FIG. 1A. However, in this embodiment, the CDR functionality of the PMA 110 is not disabled but rather controlled by the phase detector 140. The phase detector 140 does not control the oscillator 140 and/or the PLL 160. As such, the oscillator 140 may be free running oscillator. Accordingly, the phase detector 140 directly modulates the CDR output frequency of the PMA 110. FIG. 4B is similar to FIG. 4A except that a filter 410 is used for gathering statistical information similar to that described in FIG. 2.

Figure 5:
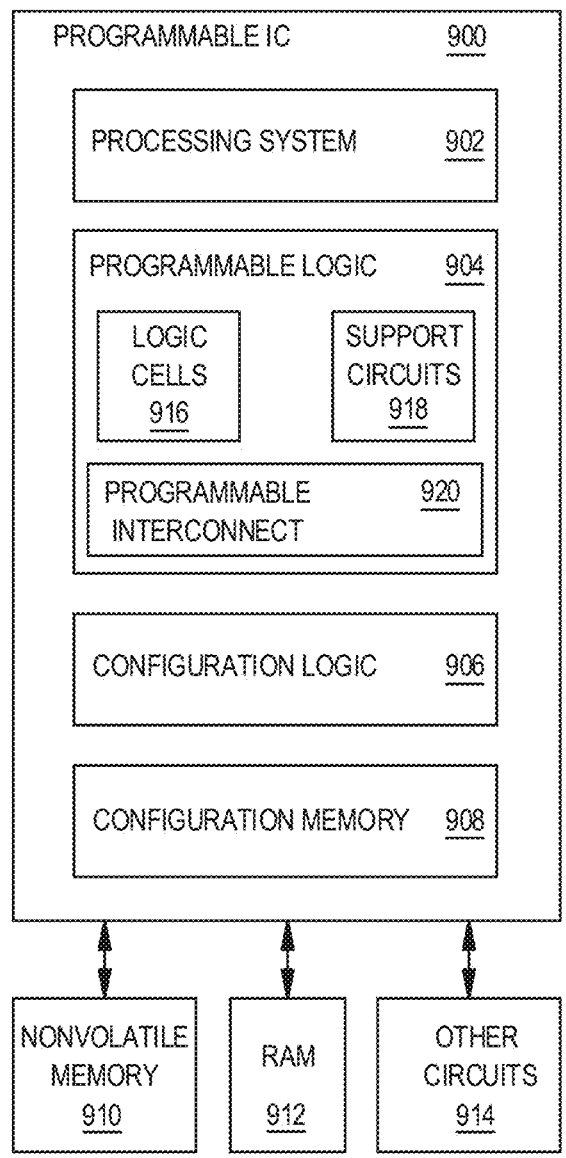
FIG. 5 is a block diagram depicting a programmable integrated circuit (IC), according to some examples.

FIG. 5 is a block diagram depicting a programmable integrated circuit (IC) 900 according to an example. The programmable IC 900 can implement the integrated circuit (IC) chip of systems of FIGS. 1A-4B, in whole or in part. The programmable IC 900 includes a processing system 902, programmable logic 904, configuration logic 906, and configuration memory 908. The programmable IC 900 can be coupled to external circuits, such as nonvolatile memory 910, RAM 912, and other circuits 914.

The processing system 902 can include microprocessor(s), memory, support circuits, IO circuits, and the like. The programmable logic 904 includes logic cells 916, support circuits 918, and programmable interconnect 920. The logic cells 916 include circuits that can be configured to implement general logic functions of a plurality of inputs. The support circuits 918 include dedicated circuits, such as transceivers, input/output blocks, digital signal processors, memories, and the like. The logic cells and the support circuits 918 can be interconnected using the programmable interconnect 920. Information for programming the logic cells 916, for setting parameters of the support circuits 918, and for programming the programmable interconnect 920 is stored in the configuration memory 908 by the configuration logic 906. The configuration logic 906 can obtain the configuration data from the nonvolatile memory 910 or any other source (e.g., the RAM 912 or from the other circuits 914).

Figure 6:
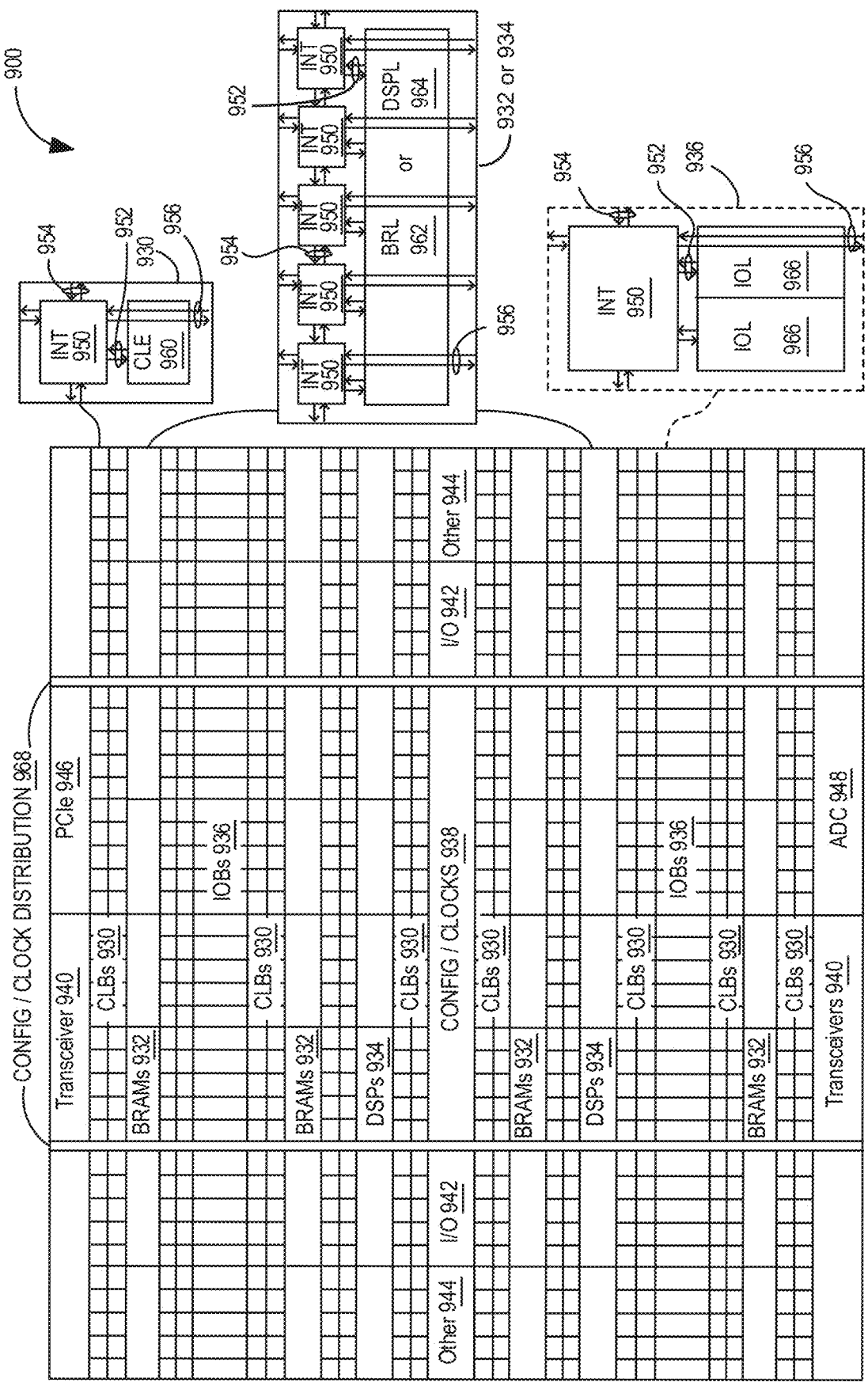
FIG. 6 is a field programmable gate array (FPGA) implementation of the programmable IC, according to some examples.

FIG. 6 illustrates an FPGA implementation of the programmable IC 900 that includes a large number of different programmable tiles including configurable logic blocks ("CLBs") 930, random access memory blocks ("BRAMs") 932, signal processing blocks ("DSPs") 934, input/output blocks ("IOBs") 936, configuration and clocking logic ("CONFIG/CLOCKS") 938, digital transceivers 940, specialized input/output blocks ("I/O") 942 (e.g., configuration ports and clock ports), and other programmable logic 944 such as digital clock managers, system monitoring logic, and so forth. The FPGA can also include PCIe interfaces 946, analog-to-digital converters (ADC) 948, and the like.

In some FPGAs, each programmable tile can include at least one programmable interconnect element ("INT") 950 having connections to input and output terminals 952 of a programmable logic element within the same tile, as shown by examples included in FIG. 9. Each programmable interconnect element 950 can also include connections to interconnect segments 954 of adjacent programmable interconnect element(s) in the same tile or other tile(s). Each programmable interconnect element 950 can also include connections to interconnect segments 956 of general routing resources between logic blocks (not shown). The general routing resources can include routing channels between logic blocks (not shown) comprising tracks of interconnect segments (e.g., interconnect segments 956) and switch blocks (not shown) for connecting interconnect segments. The interconnect segments of the general routing resources (e.g., interconnect segments 956) can span one or more logic blocks. The programmable interconnect elements 950 taken together with the general routing resources implement a programmable interconnect structure ("programmable interconnect") for the illustrated FPGA.

In an example implementation, a CLB 930 can include a configurable logic element ("CLE") 960 that can be programmed to implement user logic plus a single programmable interconnect element ("INT") 950. A BRAM 932 can include a BRAM logic element ("BRL") 962 in addition to one or more programmable interconnect elements. Typically, the number of interconnect elements included in a tile depends on the height of the tile. In the pictured example, a BRAM tile has the same height as five CLBs, but other numbers (e.g., four) can also be used. A signal processing block 934 can include a DSP logic element ("DSPL") 964 in addition to an appropriate number of programmable interconnect elements. An 10B 936 can include, for example, two instances of an input/output logic element ("IOL") 966 in addition to one instance of the programmable interconnect element 950. As will be clear to those of skill in the art, the actual I/O pads connected, for example, to the input/output logic element 966 typically are not confined to the area of the input/output logic element 966.

In the pictured example, a horizontal area near the center of the die is used for configuration, clock, and other control logic. Vertical columns 968 extending from this horizontal area or column are used to distribute the clocks and configuration signals across the breadth of the FPGA.

Some FPGAs utilizing the architecture illustrated in FIG. 9 include additional logic blocks that disrupt the regular columnar structure making up a large part of the FPGA. The additional logic blocks can be programmable blocks and/or dedicated logic.

Note that FIG. 6 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 6 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A device comprising:
   a physical medium attachment (PMA) configured to receive data at a first speed, wherein the PMA is further configured to overclock the received data to a second speed wherein the second speed is higher than the first speed;
   a physical coding sublayer (PCS) configured to receive the data at the second speed;
   a phase detector configured to receive another data from the PCS wherein the another data is based on the received data at the second speed or the phase detector is configured to receive the data at the second speed directly from the PMA, wherein the phase detector is further configured to adjust a phase based on bit transitions; and
   an oscillator coupled to the phase detector, wherein the oscillator is configured to generate a reference clock signal wherein a phase of the reference clock is adjusted by the phase detector, and wherein the oscillator is configured to clock the PMA based on the adjusted clock.

2. The device of claim 1 further comprising a phase locked loop (PLL) coupled to the oscillator, wherein the PLL is configured to increase a frequency of the adjusted clock.

3. The device of claim 1, wherein the PCS is overclocked to increase speed of the data at the second speed to a third speed, and wherein the data at the third speed is transmitted to the phase detector.

4. The device of claim 1, wherein the data transmitted by the PMA bypasses the PCS and is received by the phase detector.

5. The device of claim 4 further comprising a directional interface configured to facilitate transmission of the data from the PMA to the phase detector.

6. The device of claim 1 further comprising a filter coupled to output of the phase detector to accumulate statistical data associated with a phase to be adjusted.

7. The device of claim 1, wherein the phase detector is within a fabric of a field programmable gate array (FPGA) and wherein the PMA and the PCS are within a transceiver, and wherein a lock to reference of the PMA is disabled.

8. The device of claim 1 further comprising a contra directional interface configured to facilitate transmission of the another data from the PCS to the phase detector.

9. A device comprising:
   a physical medium attachment (PMA) configured to receive data at a first speed, wherein the PMA is further configured to overclock the received data to a second speed wherein the second speed is higher than the first speed;
   a physical coding sublayer (PCS) configured to receive the data at the second speed;
   a phase detector configured to receive another data from the PCS wherein the another data is based on the received data at the second speed or the phase detector is configured to receive the data at the second speed from the PMA, wherein the phase detector is further configured to adjust a phase based on bit transitions;
   an oscillator configured to generate a clocking signal; and
   a phase locked loop (PLL) coupled to the phase detector, wherein the PLL is configured to increase a frequency of a clock, and wherein the PLL is adjusted based on the phase adjustment of the phase detector to generate a reference clock signal, and wherein the PLL is configured to clock the PMA based on the reference clock.

10. The device of claim 9, wherein the PCS is overclocked to increase speed of the data at the second speed to a third speed, and wherein the data at the third speed is transmitted to the phase detector.

11. The device of claim 9, wherein the data transmitted by the PMA bypasses the PCS and is received by the phase detector.

12. The device of claim 11 further comprising a directional interface configured to facilitate transmission of the data from the PMA to the phase detector.

13. The device of claim 9 further comprising a filter coupled to output of the phase detector to accumulate statistical data associated with a phase to be adjusted.

14. The device of claim 9, wherein the phase detector is within a fabric of a field programmable gate array (FPGA) and wherein the PMA and the PCS are within a transceiver.

15. The device of claim 9 further comprising a contra directional interface configured to facilitate transmission of the another data from the PCS to the phase detector.

16. A device comprising:
  a physical medium attachment (PMA) configured to receive data at a first speed, wherein the PMA is further configured to receive a clocking signal, wherein the PMA is further configured to overclock the received data to a second speed wherein the second speed is higher than the first speed;
  a physical coding sublayer (PCS) configured to receive the data at the second speed; and
  a phase detector configured to receive another data from the PCS wherein the another data is based on the received data at the second speed or the phase detector is configured to receive the data at the second speed from the PMA, wherein the phase detector is further configured to generate a control signal based on bit transitions, and wherein the control signal is transmitted from the phase detector to the PMA and wherein the control signal adjusts a phase of the clocking signal for the PMA that controls lock to reference of the PMA.

17. The device of claim 16 further comprising:
  an oscillator configured to generate an oscillating signal; and
  a phase locked loop (PLL) coupled to the oscillator, wherein the PLL is configured to increase a frequency of the oscillating signal to generate the clocking signal.

18. The device of claim 16, wherein the PCS is overclocked to increase speed of the data at the second speed to a third speed, and wherein the data at the third speed is transmitted to the phase detector using a contra directional interface.

19. The device of claim 16, wherein the data transmitted by the PMA bypasses the PCS and is received by the phase detector using a directional interface.

20. The device of claim 16 further comprising a filter coupled to output of the phase detector to accumulate statistical data associated with a phase to be adjusted.

21. The device of claim 16, wherein the phase detector is within a fabric of a field programmable gate array (FPGA) and wherein the PMA and the PCS are within a transceiver.

* * * * *